United States Patent [19]

Park

[11] Patent Number: 5,469,388
[45] Date of Patent: Nov. 21, 1995

[54] ROW REDUNDANCY CIRCUIT SUITABLE FOR HIGH DENSITY SEMICONDUCTOR MEMORY DEVICES

[75] Inventor: Chan-Jong Park, Seoul, Rep. of Korea

[73] Assignee: Samsung Electronics Co., Ltd., Suwon, Rep. of Korea

[21] Appl. No.: 155,747

[22] Filed: Nov. 23, 1993

[30] Foreign Application Priority Data

Nov. 23, 1992 [KR] Rep. of Korea ................ 22113/1992

[51] Int. Cl.⁶ .............................. G11C 29/00; G11C 7/00
[52] U.S. Cl. ................ 365/200; 365/225.7; 365/230.06; 371/10.3
[58] Field of Search ................................ 365/210, 225.7, 365/200, 201, 230.06; 371/10.1, 10.2, 10.3

[56] References Cited

U.S. PATENT DOCUMENTS

5,257,229  10/1993  McClure et al. ................ 365/225.7 X
5,265,055  11/1993  Horiguchi et al. ................ 365/200

*Primary Examiner*—David C. Nelms
*Assistant Examiner*—Huan Hoang
*Attorney, Agent, or Firm*—Charles R. Donohoe; Stephen R. Whitt

[57] ABSTRACT

A semiconductor memory device has a plurality of memory cell arrays, each with a normal cell array and a spare cell array. Fuse circuits are programmable to substitute a spare-cell-array word line for a defective word line in any normal cell array. When a defective word line is addressed, a fuse circuit activates a spare-cell-array word line, and also activates a redundancy signal line. A single redundancy signal line is shared by all fuse circuits and block select circuits. Block select circuits normally enable the cell array that includes the defective word line, however, the block select circuits are disabled when the defective word line has been replaced by a spare word line an another block.

10 Claims, 11 Drawing Sheets

ROW REDUNDANCY CIRCUIT SUITABLE FOR HIGH DENSITY SEMICONDUCTOR MEMORY DEVICES

BACKGROUND OF THE INVENTION

The present invention relates to semiconductor memory devices and more particularly, to a row redundancy circuit suitable for high density memory devices and semiconductor memory devices having the same.

It is well known that the redundancy circuit increases the yield of the semiconductor memory devices. The redundancy circuit replaces a defective memory cell with a spare or redundant memory cell. A row redundancy circuit, for example, decodes the row address for designating the defective memory cell to replace the defective memory cell with a spare memory cell. Here, the "row" extends along the direction of the word lines. In general, the higher density a semiconductor memory device has, the more memory cells the semiconductor memory device includes in the unit area. Further, a memory cell array is divided into a number of memory cell array blocks, and the memory cell array blocks increase in number as the density of the semiconductor memory device increases.

Figure 1:
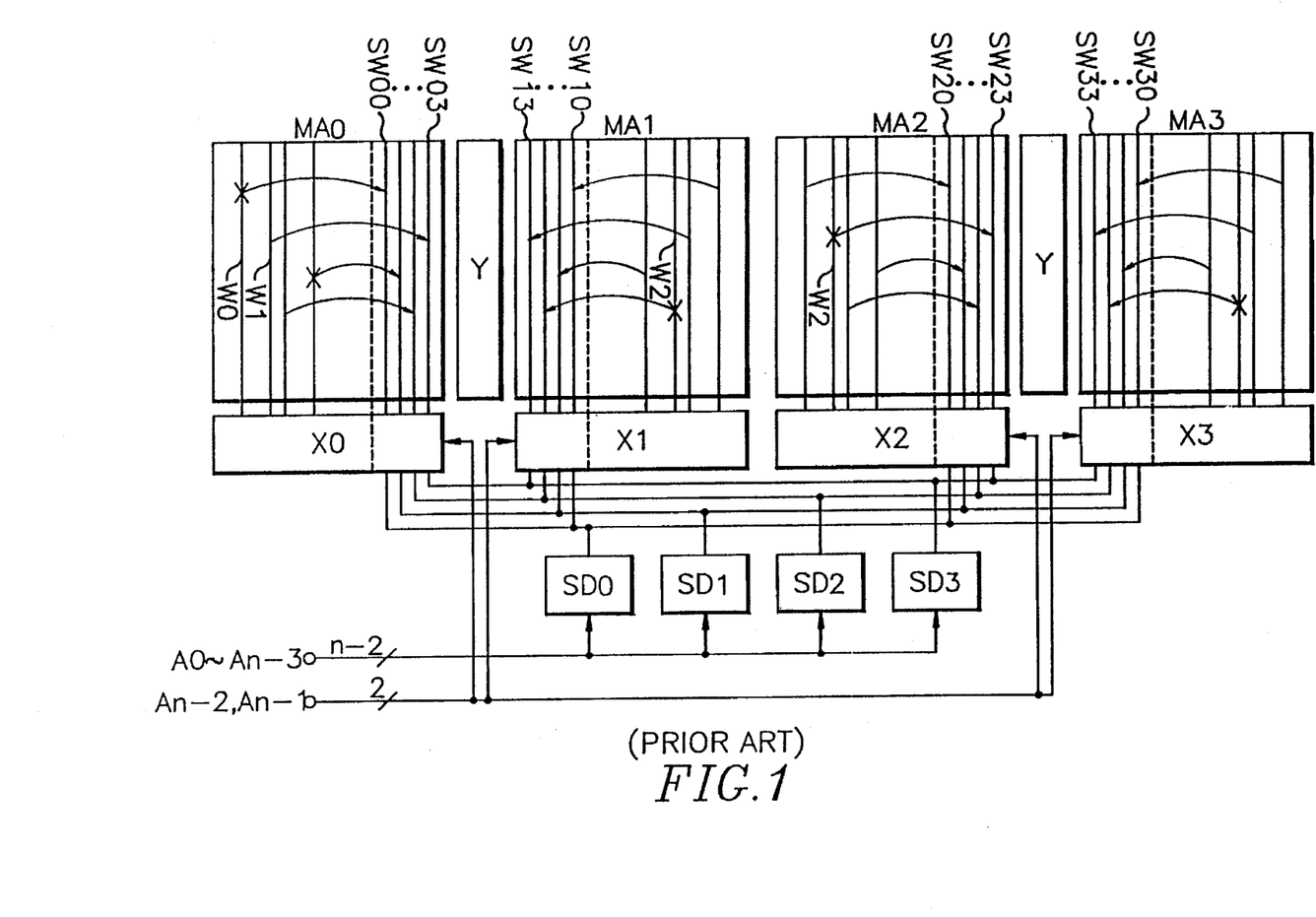
FIG. 1 illustrates a conventional row redundancy circuit.

FIG. 1 is a schematic diagram of a conventional redundancy circuit. In the drawing, a memory cell array is divided into four memory cell array blocks MA0, MA1, MA2 and MA3. Each of the memory cell array blocks MA0, MA1, MA2 and MA3 includes normal row decoders X0, X1, X2 and X3 and spare word lines (SW00–SW03; SW10–SW13; SW20–SW23; and SW30–SW33). Spare row decoders SD0, SD1, SD2 and SD3 are then provided for driving the spare word lines during the redundancy operation. The number of the spare row decoders SD0, SD1, SD2 and SD3 is the same as the number of the spare word lines in each of memory cell array block MA0, MA1, MA2 and MA3. The spare row decoders SD0, SD1, SD2 and SD3 receive the address signals A0~An-3, to drive the spare word lines. Thus, when a defect occurs at a normal word line in, for example, the memory cell array block MA0, the defect is programmed in the spare row decoders SD0, SD1, SD2 and SD3 to replace the defective normal word line with the spare word lines SW00–SW03. In this device, however, although one or two normal word lines are defective in the same memory cell array block, four spare word lines in the same redundant memory cell array are all substituted for the defective normal word lines including non-defective word lines, thus reducing the efficiency of the redundancy. Further, since the respective memory cell array blocks include their own four spare word lines, the chip size will increase.

Figure 2:
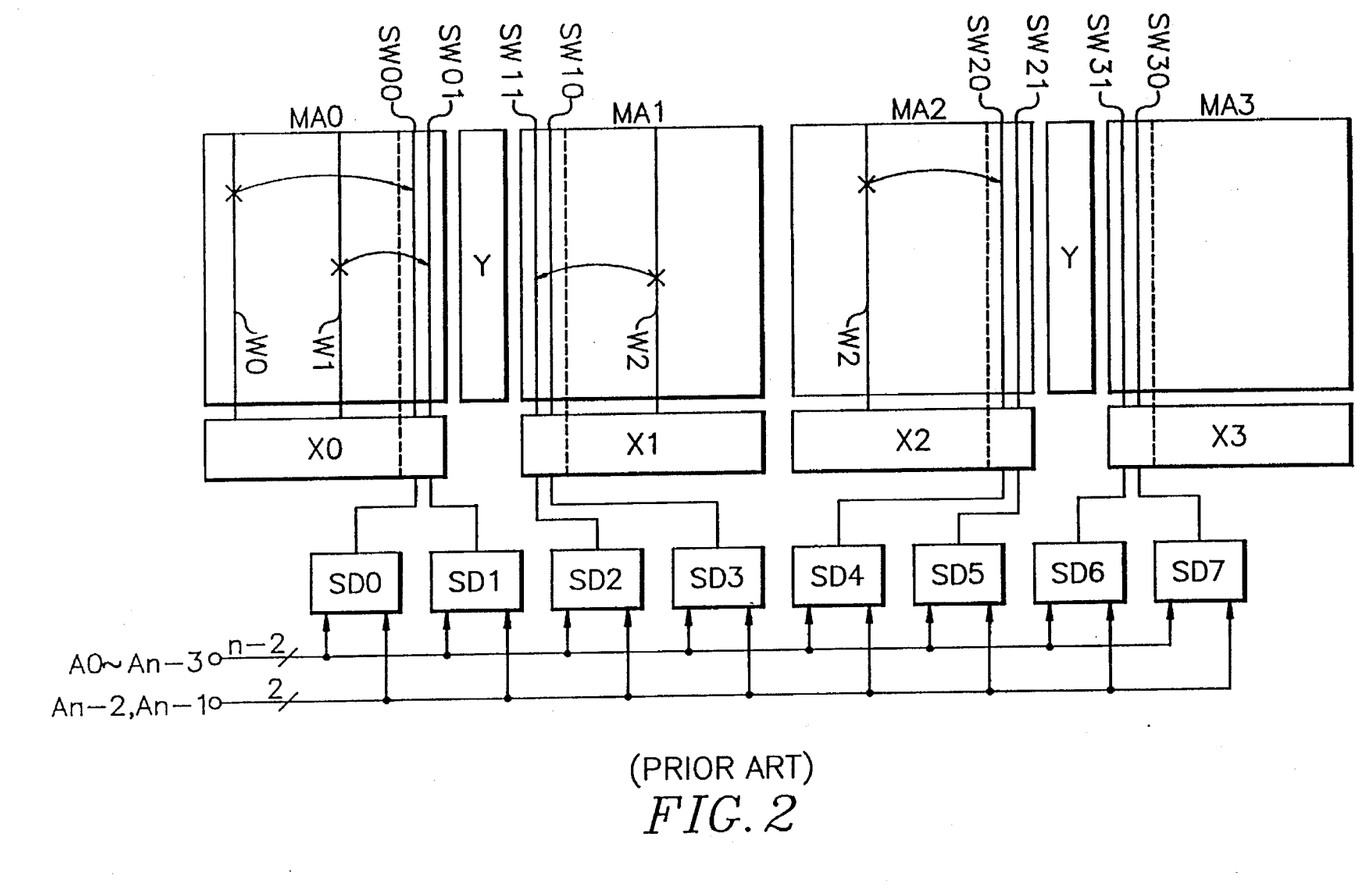
FIG. 2 illustrates another conventional row redundancy circuit.

In FIG. 2, another conventional redundancy circuit is shown which can solve the above-mentioned problems. This device includes the memory cell array blocks MA0–MA3 each having two spare word lines which are fewer in number than that of FIG. 1, and spare row decoders SD0–SD7 each for driving the respective spare word lines SW00, SW01, SW10, SW11, SW20, SW21, SW30 and SW31. Accordingly, if a normal word line is defective, only the defective word line is replaced with a spare word line, under the control of the corresponding spare row decoder. Such a redundancy circuit can substitute the defective word lines on a line-by-line basis, because the spare word lines SW00, SW01, SW10, SW11, SW20, SW21, SW30 and SW31 are controlled by their own spare row decoders SD0–SD7. However, when more than two normal word lines are defective, the defect cannot be repaired, because each memory cell array block includes only two spare word lines. Further, it is not possible to repair a defective normal word line in a memory cell array block by using a spare word line in an adjacent memory cell array block. More significantly, since each spare word line should be connected to its own spare row decoder, the total number of the spare decoders increases, which would inevitably be reduced in a high density memory device.

Figure 3:
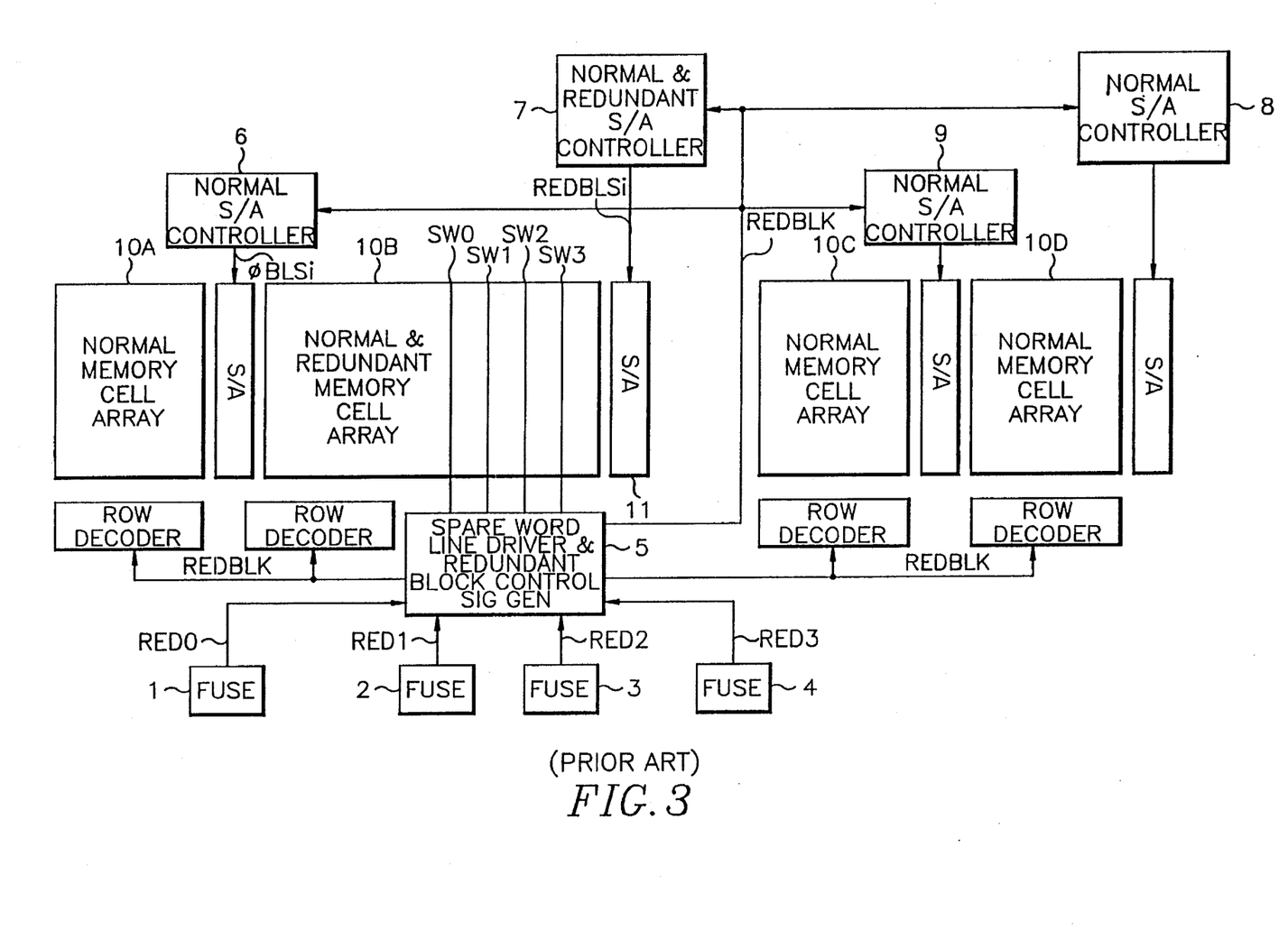
FIG. 3 illustrates still another conventional row redundancy circuit.

FIG. 3 shows another conventional redundancy circuit for solving the problems mentioned above, which is disclosed in Korean patent application 12437/1992 filed by Samsung Electronics. The conventional device includes a memory cell array divided into four memory cell array blocks 10A, 10B, 10C and 10D. Of the four memory cell array blocks, the memory cell array block 10B only includes a redundant memory cell array consisting of spare word lines SW0–SW3. Further, a number of fuse boxes 1 through 4 are provided to repair any defective word lines from the memory cell array blocks 10A, 10B, 10C and 10D, by using the spare word lines SW0–SW3. However, since the spare word lines are all concentrated in the memory cell array block 10B, the capacitances formed between bit lines of the memory cell array block 10B become higher, compared to other memory cell array blocks 10A, 10C and 10D, thus causing relatively lower sensing ability. Moreover, the output signals RED0–RED3 from the fuse boxes 1 to 4 are supplied to a spare word line driver and redundant block control signal generator 5 by way of bus lines interposed therebetween. In the high density semiconductor memory devices, if the bus lines are arranged in the core portion of the memory devices, it would be disadvantageous for the effective lay-out and the high density of the chips.

SUMMARY OF THE INVENTION

It is an object of the present invention to provide an improved row redundancy circuit suitable for high density semiconductor memory devices.

Another object of the present invention is to provide a semiconductor memory device having a good yield.

Another object of the present invention is to provide a row redundancy circuit for a semiconductor memory device having multiple memory cell arrays, and in which a spare word line in one memory cell array can substitute for a defective word line in any memory cell array.

Another object of the present invention is to provide a row redundancy circuit having fuse circuits which have improved layout flexibility and which can be programmed to substitute a spare word line in one memory cell array for a defective word line in a normal memory cell array.

These and other objectives are accomplished by providing a semiconductor memory device partitioned into memory cell arrays. Each cell array has a normal cell array and a spare cell array. Each cell array has corresponding row decode circuits, in addition to a corresponding fuse circuit and block select circuit.

Each fuse circuit is programmable so as to activate a word line in its associated spare cell array in response to an address of a defective word line in any normal cell array—either in the associated memory cell array or in another memory cell array. All fuse circuits share a common signal line (redundancy signal line). Fuse circuits activate the redundancy signal line when any spare cell word line is active, and thus operating in substitution for a defective word line of a normal cell array. The redundancy line may be spaced apart from the normal memory cell arrays.

Block select circuits enable the appropriate normal cell array which contains an addressed word line. When the address is for a defective normal word line, a fuse circuit activates a spare word line and activates the redundancy signal. The redundancy signal inhibits the defective word line.

Spare memory arrays may be distributed throughout the memory device, while maintaining flexibility to substitute for any defective array. The redundancy signal is shared on a single line, which reduces the surface area used by the redundancy circuit.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENTS

Figure 4A:
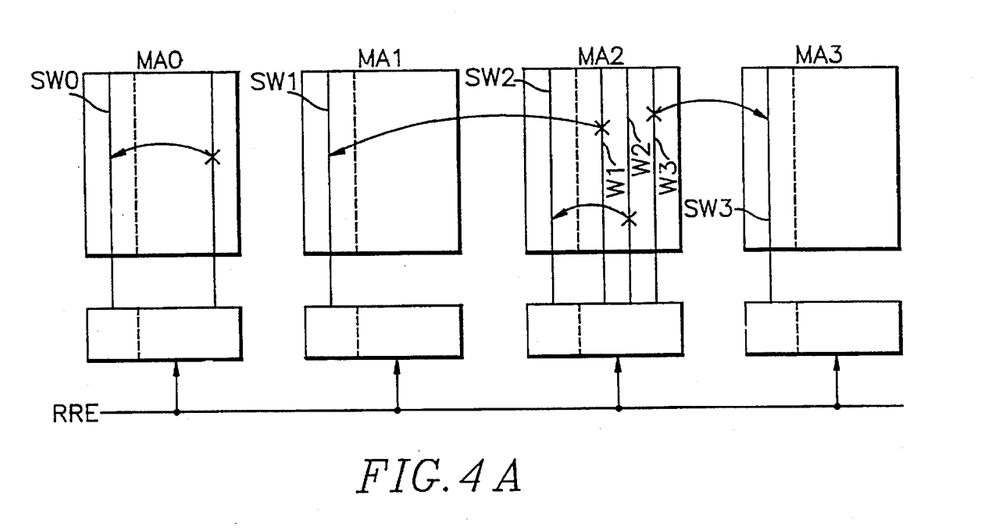
FIGS. 4A and 4B are block diagrams for illustrating how the repairing operations are performed in a row redundancy circuit according to the present invention.

FIG. 4A shows memory cell arrays MA0, MA1, MA2 and MA3 each have their own spare word lines SW0, SW1, SW2 and SW3. In the simplest example, each memory cell array has one spare word line, but any spare word line can substitute for a defective word line in another cell array. For example, defective normal word lines W1 and W3 in the memory cell array MA2 can be replaced with spare word lines SW1 and SW3 in the adjacent memory cell arrays MA1 and MA3. Further, a redundancy enable signal RRE is supplied to the memory cell arrays MA0, MA1, MA2 and MA3 through a single bus line. Therefore, the defective word lines W1, W2 and W3 in the memory cell array MA2 can be replaced with the spare word lines SW1 and SW3 in the adjacent memory cell arrays MA1 and MA3 as well as the spare word line SW2 in the memory cell array MA2 itself, so that the redundancy efficiency may increase drastically. Further, since the redundancy enable signal RRE is delivered through the single bus line, the device may provide the effective lay-out for the high density semiconductor memory devices which are made under the sub-micron design rule. In general, the semiconductor memory devices are comprised of the memory core region and the peripheral circuit region, and the redundancy enable signal bus line RRE is arranged in the peripheral circuit region.

Figure 4B:
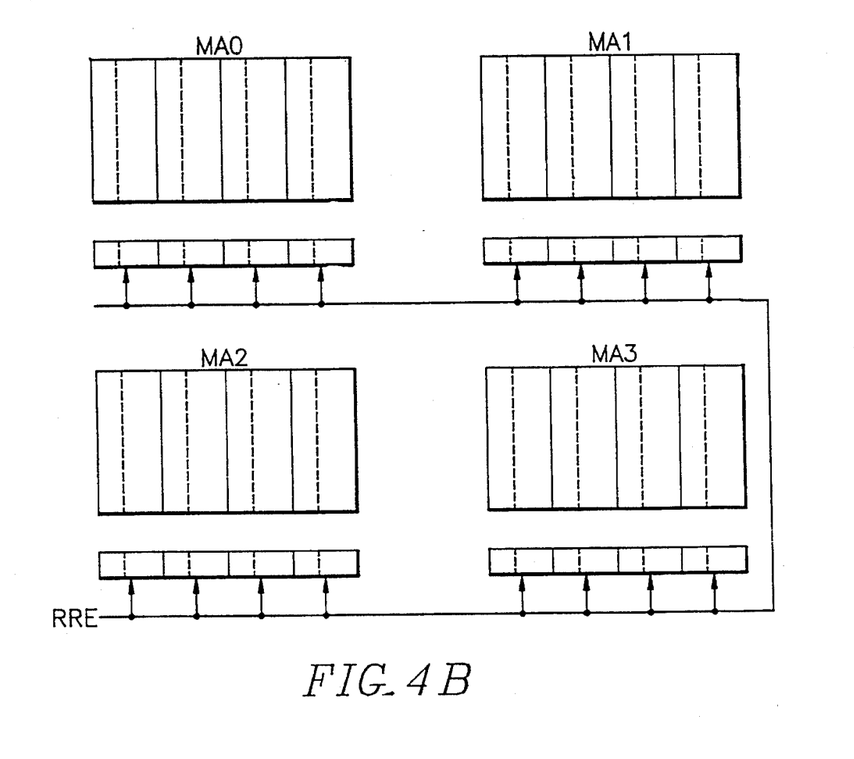

FIG. 4B illustrates the row redundancy circuit according to the present invention, in case that each of the memory cell arrays MA0, MA1, MA2 and MA3 is again divided into four sub-memory cell arrays, and each sub-array has at least one spare word line. Details of operation of the redundancy enable signal RRE will be discussed below.

Figure 4C:
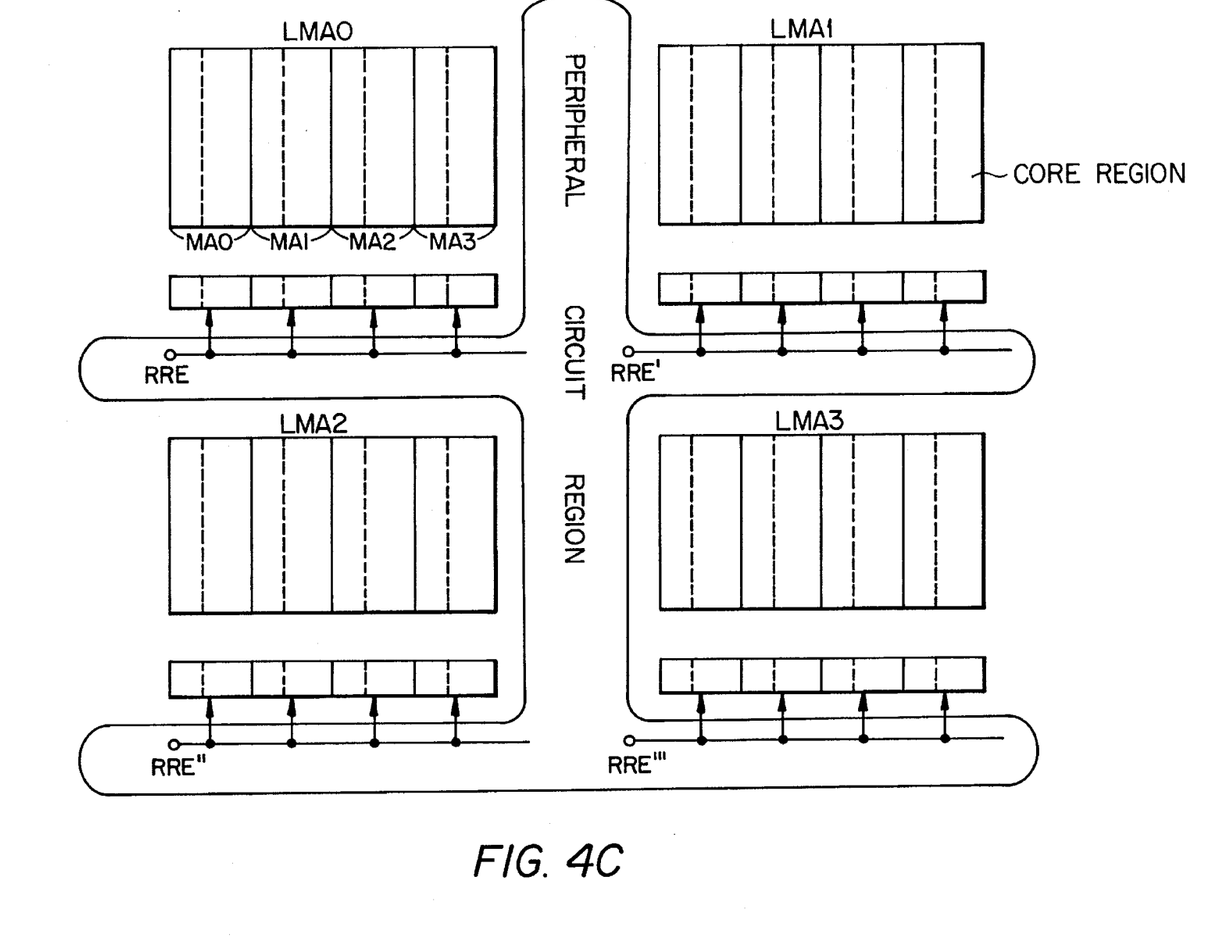
FIG. 4C shows an example in which each of a number of large memory areas are subdivided into memory areas.

FIG. 4C shows an example in which each of a number of large memory areas LMA0, LMA1, LMA2, LMA3 are subdivided into memory areas MA0, MA1, MA2, MA3. It will be understood that the redundancy driving circuitry may be expanded to accomodate the additional addressing of these areas. It should also be understood that layout can be simplified by routing redundancy signals RRE, RRE', RRE" and RRE'" in a peripheral circuit region, while the memory arrays are located in a central or core region.

Figure 5:
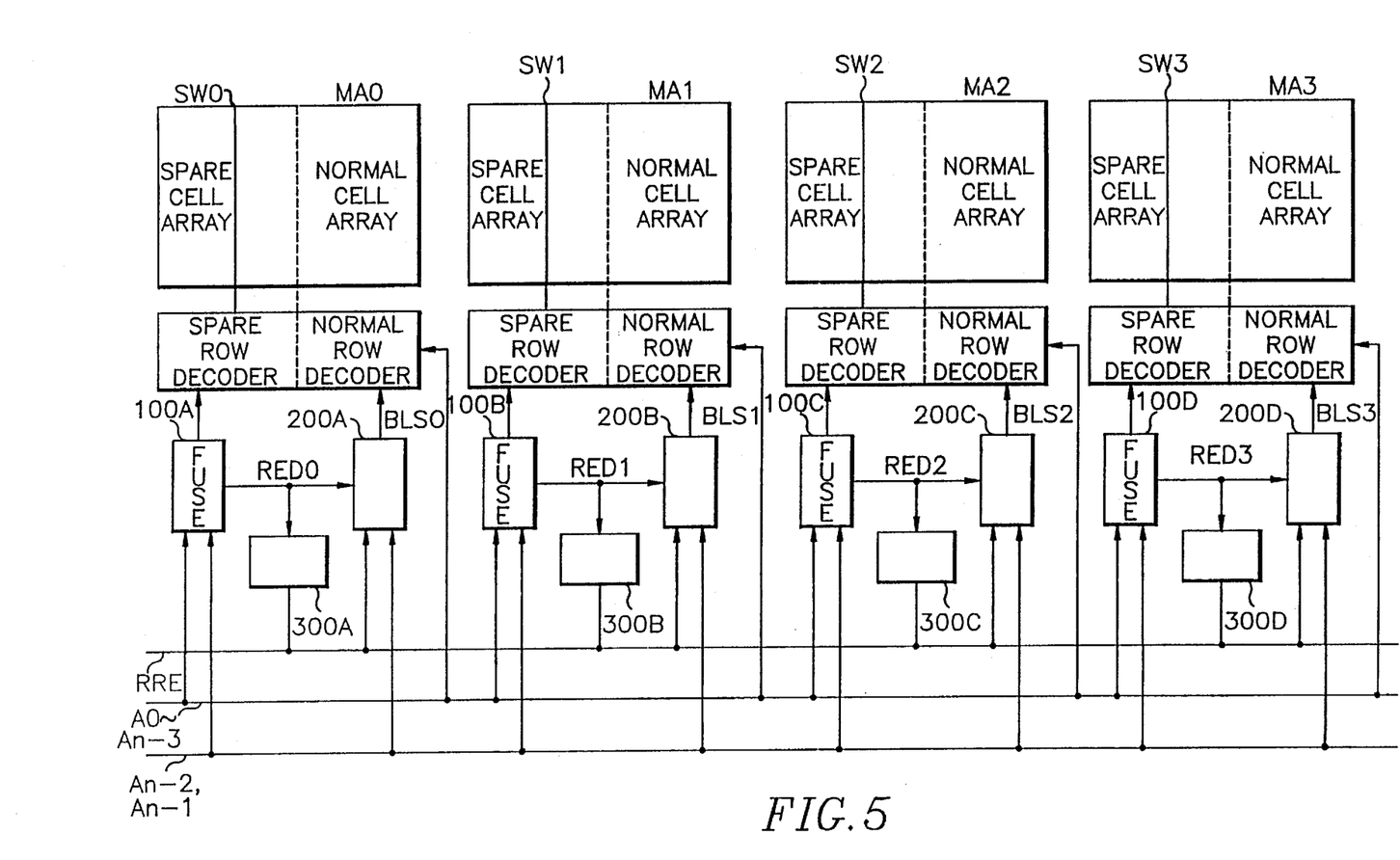
FIG. 5 is a schematic block diagram for illustrating how the row redundancy circuit is applied to a semiconductor memory device according to the present invention.

FIG. 5 shows details of a semiconductor memory device including the row redundancy circuit according to the present invention. The memory device includes normal memory cell arrays MA0, MA1, MA2 and MA3, a number of normal row decoders respectively connected to the normal memory cell arrays for driving word lines in the normal memory cell arrays. The memory device also includes a number of spare memory cell arrays, each associated with each of the normal memory cell arrays MA0, MA1, MA2 and MA3. A number of spare row decoders connected to respective spare memory cell arrays drive the spare word lines SW0–SW3. Fuse boxes 100A, 100B, 100C and 100D connected to respective spare row decoders generate redundancy signals RED0–RED3 according to defects of the normal memory cells in the normal memory cell arrays. That is, when a fuse box has been programmed to allow a spare word line to replace a defective word line in a normal cell array, the fuses in the fuse box are blown to detect the address signal of the defective word line. Block selection circuits (BSC) 200A, 200B, 200C and 200D connected to respective fuse boxes 100A–100D select the respective memory cell arrays. Redundancy driving circuits (RDC) 300A, 300B, 300C and 300D receive the redundancy signals RED0–RED3 of the fuse boxes 100A–100D and supply the redundancy enable signal RRE to the block selection circuits 200A–200D through a single bus line RRE. The bus line is spaced apart from the normal memory cell arrays MA0–MA3. Address signals A0–An-3, An-2 and An-1 are provided to the fuse boxes 100A–100D and the block selection circuits 200A–200D, and they are the signals used to access memory cells in the normal memory cell arrays MA0–MA3. The block selection circuits 200A–200D each receive: a redundancy signal RED0–RED3 from a fuse box 100A–100D, the redundancy enable signal RRE and the address signals An-2 and An-1.

In operation, the address signals A–An-3, An-2 and An-1 are applied to the memory device for selecting the normal word lines in the normal memory cell arrays MA0–MA3. The fuse boxes 100A–100D are programmed in advance to recognize addresses of the defective normal word lines by selectively disconnecting fuses therein. The fuse boxes generate redundancy signals REDi (where i=0–3) of an enabling state (i.e., the logic "high" state). The fuse boxes connected to the enabled block selection circuits enable the spare row decoders connected thereto to drive the respective spare word lines.

The redundancy driving circuits 300A–300D generate the redundancy enable signal RRE in response to redundancy signals REDi. Block selection circuits 200A–200D are disabled when the RRE signal is true. However, the block selection circuit to which the logic-high redundancy signal REDi of the enabling state is applied remains enabled.

Figure 6A:
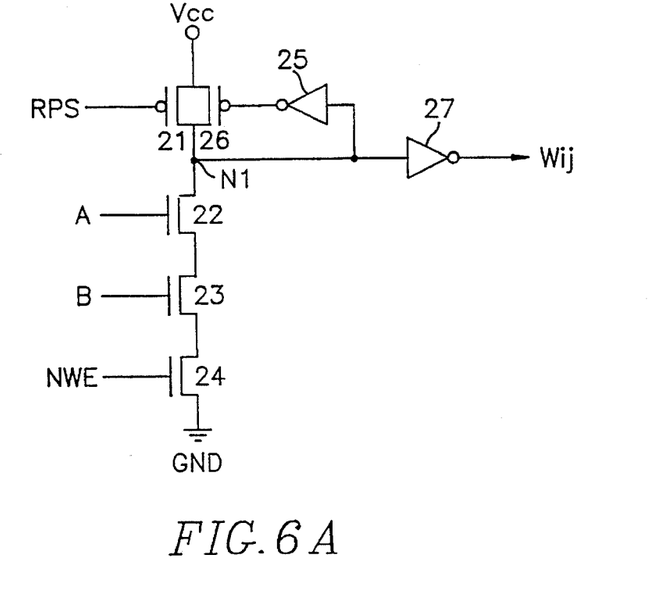
FIG. 6A illustrates a normal row decoder of FIG. 5 according to an embodiment of the present invention.

FIG. 6A shows a normal row decoder. When the row precharge signal RPS is at the logic "low" state, the voltage at a node N1 becomes the logic "high", and a word line driving signal Wij indicating a j-th word line in an i-th normal memory cell array MAi becomes the logic "low" state. In the meantime, if row address signals RA0 and RA1 are applied to the gates A and B of MOS transistors 22 and 23, and if the normal word line enable signal NWE is at the logic "high" enable state, the word line driving signal Wij may switch in response to the row address signals as shown in Table 1.

TABLE 1

| A | B | Wij |
|---|---|---|
| $\overline{RA0}$ | $\overline{RA1}$ | Wi0 |
| RA0 | $\overline{RA1}$ | Wi1 |
| $\overline{RA0}$ | RA1 | Wi2 |
| RA0 | RA1 | Wi3 |

Figure 6B:
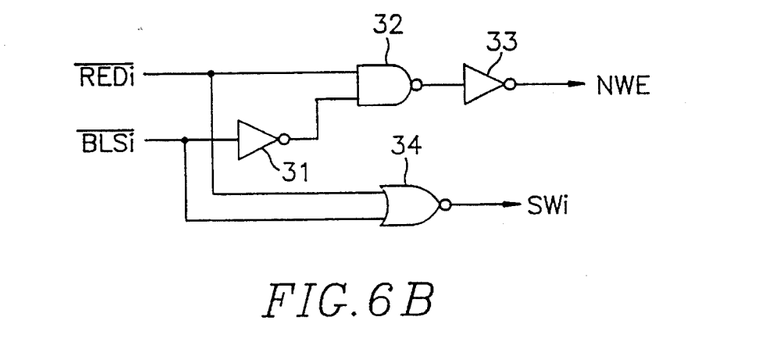
FIG. 6B illustrates a spare row decoder of FIG. 5 according to an embodiment of the present invention.

FIG. 6B shows a spare row decoder, which generates the normal word line enable signal NWE and a spare word line driving signal SWi, according to the signal inputs $\overline{REDi}$ and $\overline{BLSi}$. The normal word line enable signal (NWE) is true (logic high) when the block is selected, ($\overline{BLSi}$=0) and the redundancy signal ($\overline{REDi}$) is false (logic high).

Figure 6C:
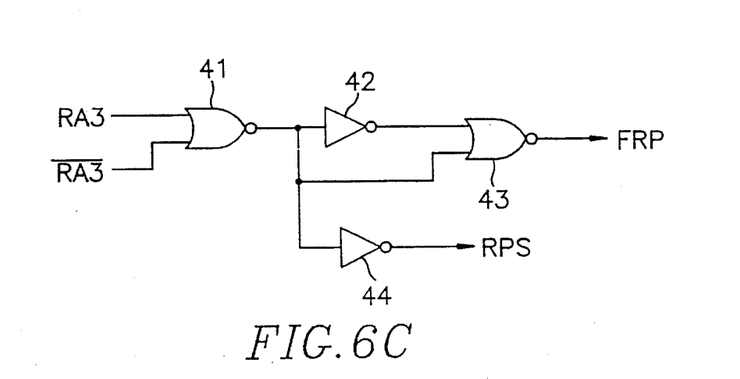
FIG. 6C illustrates a reset circuit of FIG. 5 according to an embodiment of the present invention.
Figure 7:
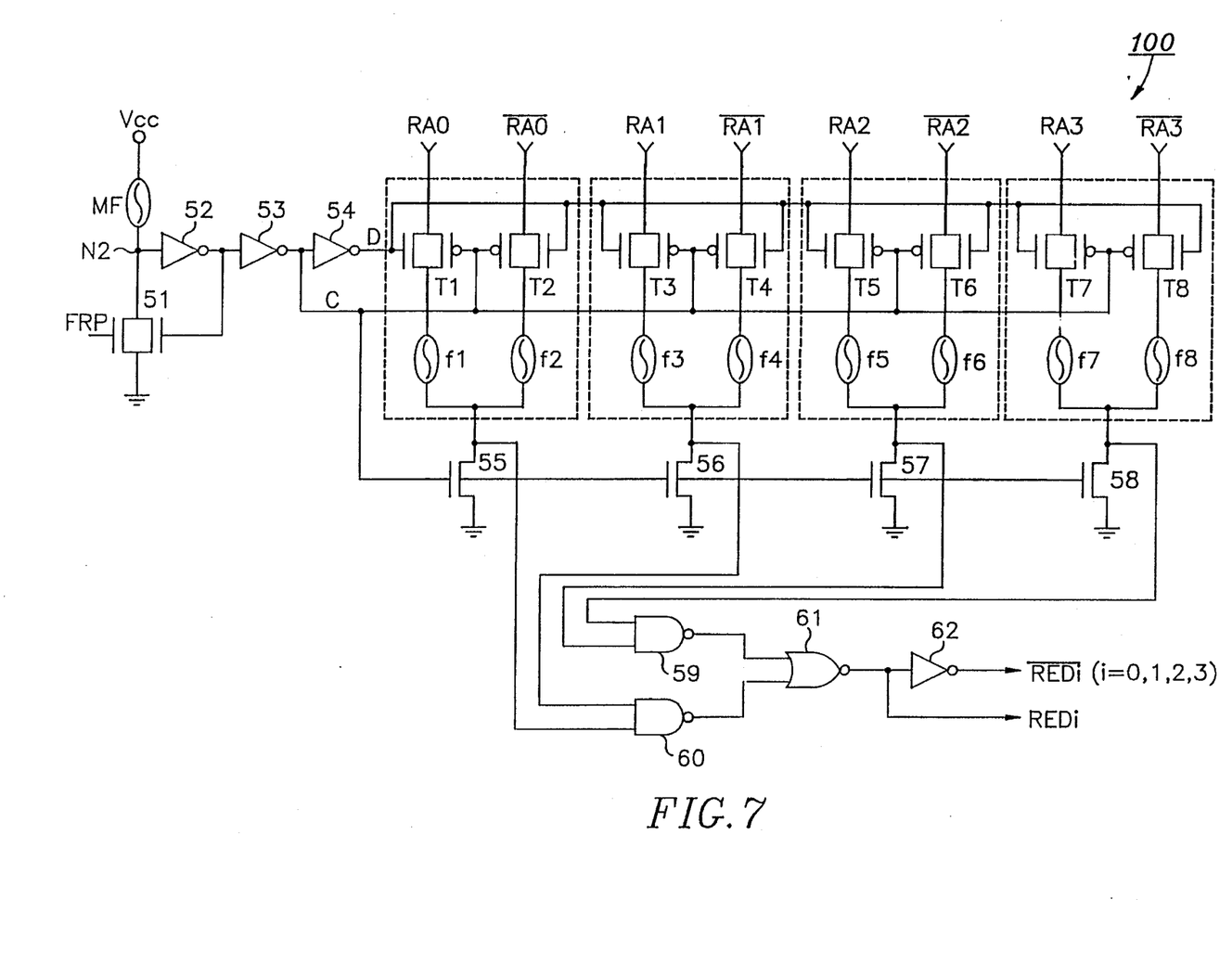
FIG. 7 illustrates a fuse box of FIG. 5 according to an embodiment of the present invention.

FIG. 7 shows a fuse box, which is reset under the reset signal FRP supplied from the reset circuit of FIG. 6C. A master fuse MF is cut off to enable the fuse box. Thereafter, the fuse box generates the redundancy signal REDi of the logic "high" state upon receiving the address signals RA0/$\overline{RA0}$–RA3/$\overline{RA3}$ for accessing the defective memory cell according to the fuses. Here, four address lines are shown, however, the number of row address lines may vary depending on the total capacity and organization of the memory device.

Figure 8:
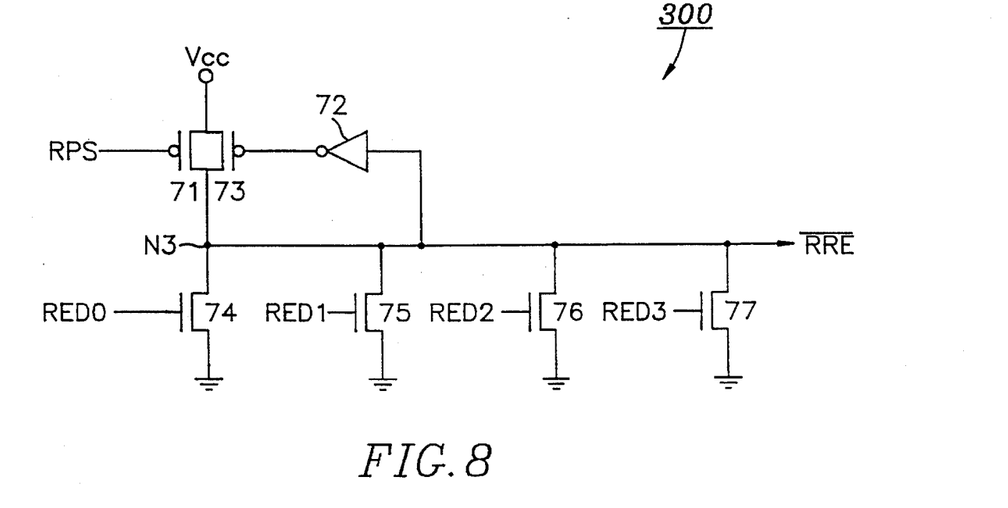
FIG. 8 illustrates a redundancy driving circuit of FIG. 5 according to an embodiment of the present invention.

FIG. 8 shows the redundancy driving circuit 300, which generates the inverse redundancy enable signal $\overline{RRE}$. In operation, if the row precharge signal RPS is at the logic "low" state, the inverse redundancy enable signal $\overline{RRE}$ is precharged to the logic "high" state. Then, if any one of the redundancy signals REDi become the logic "high" state, the inverse redundancy enable signal $\overline{RRE}$ is enabled to the logic "low" state. As shown in the drawing, the inverse redundancy enable signal $\overline{RRE}$ is transferred via a single bus line, so that the chip lay-out may be simplified.

Figure 9:
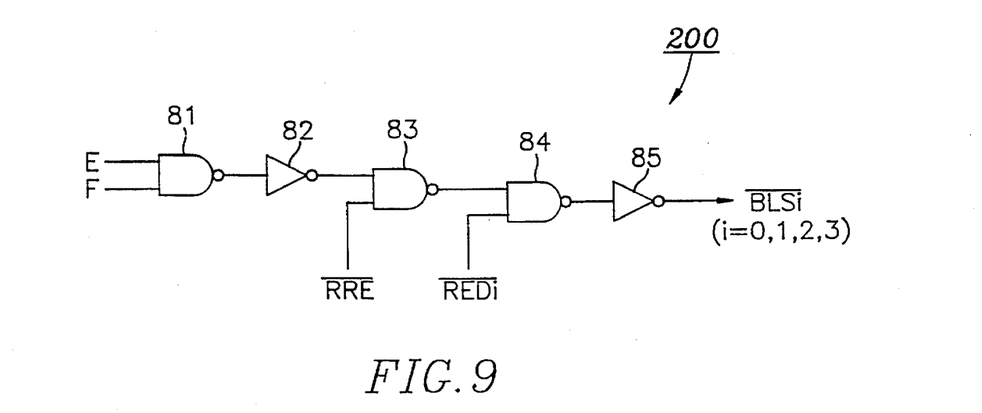
FIG. 9 illustrates a block selection circuit of FIG. 5 according to an embodiment of the present invention.

FIG. 9 shows a block selection circuit 200, which receives row address signals RA2 and RA3 at input terminals E and F and generates a block selection signal $\overline{BLSi}$. The inverse redundancy enable signal $\overline{RRE}$ and the inverse redundancy signal $\overline{REDi}$, determine the block selection signal BLSi, as shown in Table 2.

TABLE 2

| E | F | $\overline{BLSi,}$ when $\overline{RRE}$ = "H" | $\overline{BLSi,}$ when $\overline{RRE}$ = "L" |
|---|---|---|---|
| $\overline{RA2}$ | $\overline{RA3}$ | $\overline{BLS0}$ (MA0) | $\overline{BLSi}$(Mai) |
| RA2 | $\overline{RA3}$ | $\overline{BLS1}$ (MA1) | $\overline{BLSi}$(Mai) |
| $\overline{RA2}$ | RA3 | $\overline{BLS2}$ (MA2) | $\overline{BLSi}$(Mai) |
| RA2 | RA3 | $\overline{BLS3}$ (MA3) | $\overline{BLSi}$(Mai) |

Figure 10A:
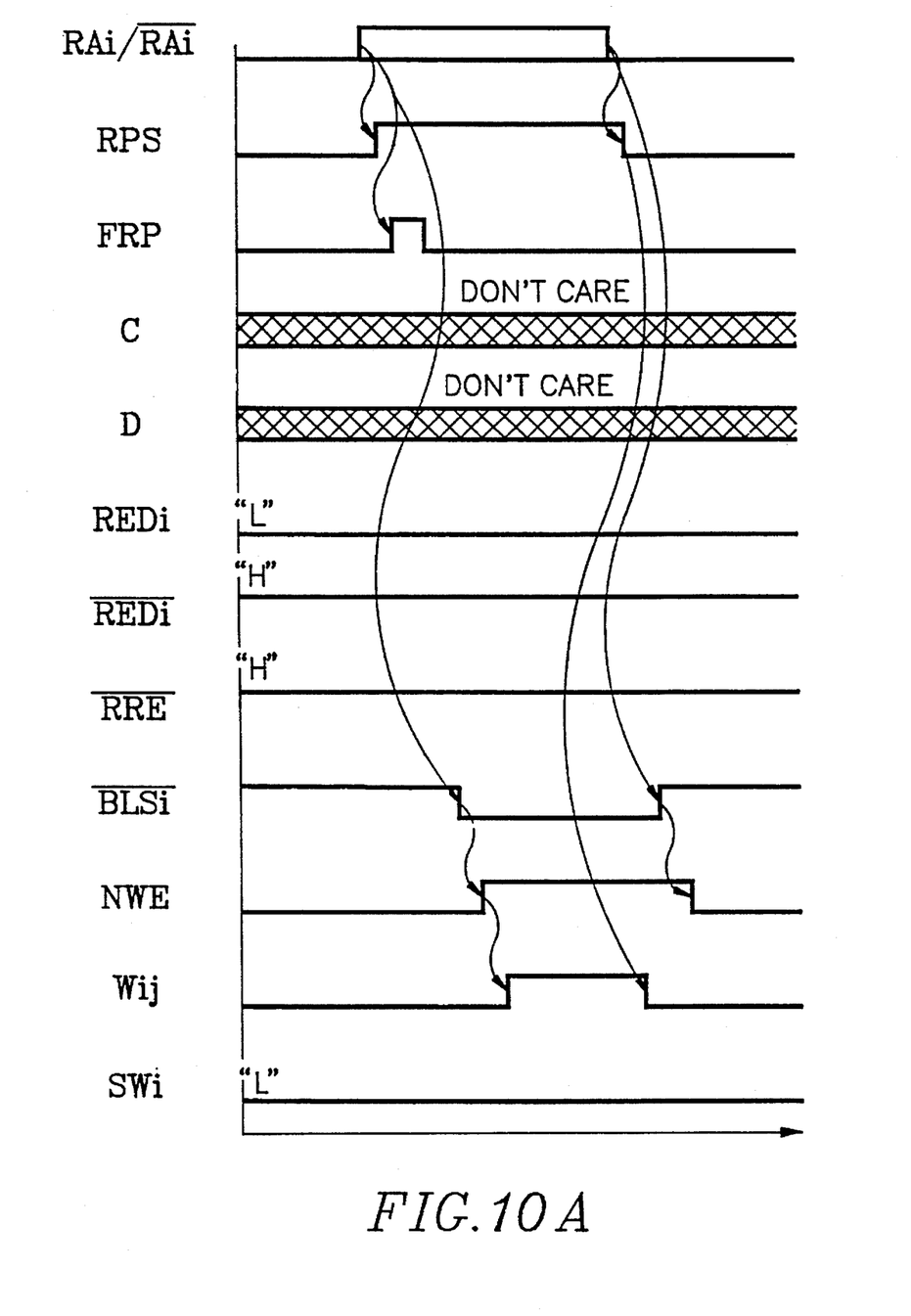
FIGS. 10A and 10B illustrate operational timing diagrams of the row redundancy circuit in FIG. 5 according to an embodiment of the present invention.

Operation of the row redundancy circuit of FIGS. 5 to 9 will be described in detail below. FIG. 10A shows an operational timing diagram for the normal word line selection, which is the conventional operation. When the master fuse MF of the fuse box in FIG. 7 is not cut, the signals at nodes C and D (FIG. 7) are respectively at the logic "high" and "low" states. Then, the row address signals RA0/$\overline{RA0}$–RA3/$\overline{RA3}$ are inhibited from being transferred to the fuse box, and the redundancy signal REDi becomes the logic "low" state. When the master fuse MF is cut and when the row address signals RA0/$\overline{RA0}$–RA3/$\overline{RA3}$ are not identical to the address programmed in the fuse box, the voltages at some of the nodes 55 through 58 (FIG. 7) become the logic "low" state while other nodes are at the logic "high" state, and the redundancy signal REDi becomes the logic "low" state. Accordingly, the normal word line enable signal NWE of FIG. 6B becomes the logic "high" state and enables the normal word line connected thereto.

Figure 10B:
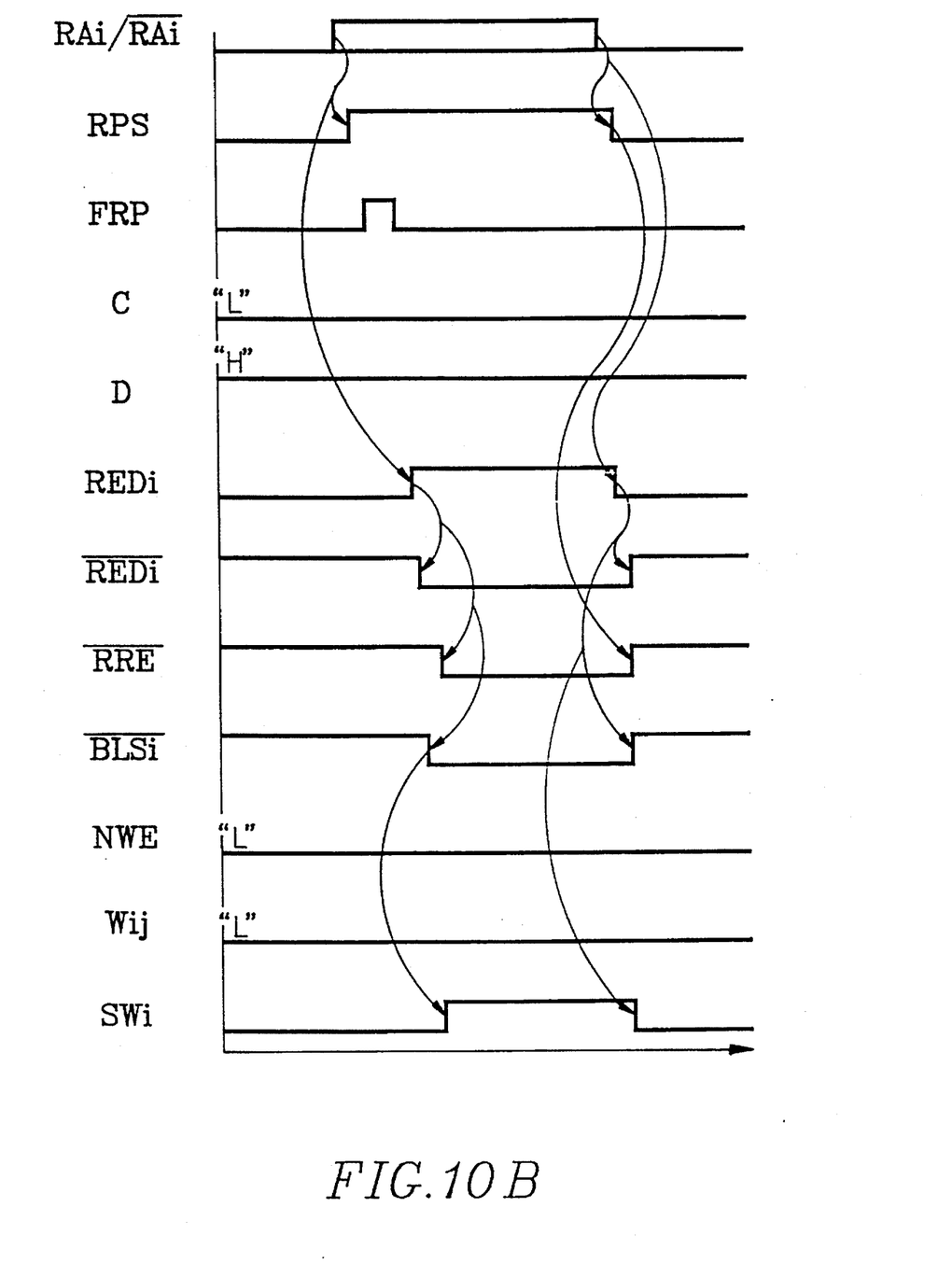

FIG. 10B shows an operational timing diagram for selecting the spare word line. If the address signals RA0/$\overline{RA0}$–RA3/$\overline{RA3}$ applied to the fuse box of FIG. 7 are identical to the address previously programmed therein, then the redundancy signal REDi changes its output to the logic "high" state. As a result, the inverse redundancy enable signal $\overline{RRE}$ of FIG. 8 goes to the logic "low" state. In this case, the block selection circuits connected to the normal memory cell arrays including the arrays having defective word lines are enabled (or disabled) as shown in Table 2. Further, in response to the inverse redundancy signal $\overline{REDi}$ and the inverse block selection signal $\overline{BLSi}$ both having the logic "low" state, the spare row decoder of FIG. 6B generates the logic "low" normal word line driving signal NWE and the logic "high" spare word line driving signal SWi, so as to disable the defective normal word lines and enable the spare word line SWi.

It can be therefore appreciated from the foregoing descriptions that a spare word line in predetermined memory cell array can freely replace the defective normal word lines in other memory cell arrays as well as in the associated memory cell array itself, thus increasing the redundancy efficiency.

Furthermore, since the redundancy enable signal RRE relates directly to the row redundancy operation, the redundancy-related bus line for transferring the redundancy enable signal RRE can be simplified, resulting in an effective lay-out for the high density semiconductor memory devices.

What is claimed is:

1. A semiconductor memory device comprising:

a plurality of memory cell arrays, each memory cell array including a normal cell array and a spare cell array;

a plurality of decoders for addressing memory cell arrays; and a row redundancy circuit that is programmable to substitute a row in a spare cell array for a defective row in any normal cell array responsive to a single redundancy enable signal supplied to each of said plurality of memory cell arrays through a single bus line.

2. The memory of claim 1 wherein the row redundancy circuit comprises:
   a plurality of fuse circuits, each programmable to substitute a spare word line for a defective word line in any normal cell array; and
   a redundancy signal line actuable by any fuse circuit when a spare word line is activated by address signals for a defective word line in said normal cell array.

3. The memory of claim 1 wherein the row redundancy circuit comprises:
   a plurality of block select circuits, each enabling an associated cell array when an addressed word line is in the associated cell array, except when a spare word line in another cell array has been substituted for the addressed word line.

4. The memory of claim 1 wherein the row redundancy circuit comprises:
   a plurality of fuse circuits, each associated with a memory cell array and programmable to substitute a spare word line for a defective word line in any normal cell array;
   a redundancy signal line actuable by any fuse circuit when a spare word line is activated by address signals for a defective word line in a normal cell array; and
   a plurality of block select circuits, each associated with a memory cell array and a fuse circuit, each enabling its associated cell array when an addressed word line is in the associated cell array, except when the redundancy signal is activated by a fuse circuit other than its associated fuse circuit.

5. The memory of claim 1 wherein the row redundancy circuit comprises:
   a plurality of fuse circuits, each programmable to substitute a spare word line for a defective word line in any normal cell array;
   a redundancy signal line actuable by any fuse circuit when a spare word line is activated by address signals for a defective word line in a normal cell array; and
   a plurality of block select circuits, each enabling an associated cell array when an addressed word line is in the associated cell array, except when a spare word line in another cell array has been substituted for the addressed word line.

6. The semiconductor memory device of claim 1, wherein said single bus line is arranged in a peripheral circuit.

7. A semiconductor memory device comprising:
   a plurality of memory cell arrays, each memory cell array including a normal cell array and a spare cell array;
   a plurality of decoders for addressing memory cell arrays;
   a plurality of fuse circuits, each programmable to substitute a spare word line for a defective word line in any normal cell array;
   a redundancy signal line actuable by any fuse circuit when a spare word line is activated by address signals for a defective word line in a normal cell array; and
   a plurality of block select circuits enabled by a redundancy enable signal provided to each of said plurality of memory cell arrays through a single bus line, each block select circuit enabling an associated cell array when an addressed word line is in the associated cell array, except when a spare word line in another cell array has been substituted for the addressed word line.

8. The semiconductor memory device of claim 7, wherein said single bus line is arranged in a peripheral circuit.

9. A semiconductor memory device comprising:
   a plurality of memory cell arrays, each memory cell array including a normal cell array and a spare cell array;
   a plurality of decoders for addressing memory cell arrays;
   a plurality of fuse circuits, each associated with a memory cell array and programmable to substitute a spare word line for a defective word line in any normal cell array;
   a redundancy signal line actuable by any fuse circuit when a spare word line is activated by address signals for a defective word line in a normal cell array; and
   a plurality of block select circuits, each associated with a memory cell array and a fuse circuit and enabled by a redundancy enable circuit supplied to each of said plurality of memory cell arrays through a single bus line, each block select circuit enabling its associated cell array when an addressed word line is in its associated cell array, except when the redundancy signal is activated by a fuse circuit with which the block select circuit is not associated.

10. The semiconductor memory device of claim 9, wherein said single bus line is arranged in a peripheral circuit.

* * * * *